United States Patent
Astrachan

(10) Patent No.: US 7,466,775 B2
(45) Date of Patent: Dec. 16, 2008

(54) METHOD AND APPARATUS FOR ACCURATELY DETECTING VALIDITY OF A RECEIVED SIGNAL

(75) Inventor: Paul Morris Astrachan, Austin, TX (US)

(73) Assignee: ViXS Systems, Inc, Toronto, Ontario (CA)

( * ) Notice: Subject to any disclaimer, the term of this patent is extended or adjusted under 35 U.S.C. 154(b) by 626 days.

(21) Appl. No.: 10/683,062

(22) Filed: Oct. 10, 2003

(65) Prior Publication Data

US 2005/0078773 A1 Apr. 14, 2005

Related U.S. Application Data

(63) Continuation-in-part of application No. 10/103,325, filed on Mar. 21, 2002, now Pat. No. 7,170,955.

(51) Int. Cl.
*H03D 1/00* (2006.01)
(52) U.S. Cl. ..................................... 375/343
(58) Field of Classification Search .................. 375/142, 375/150, 343, 209, 210
See application file for complete search history.

(56) References Cited

U.S. PATENT DOCUMENTS

| | | | | |
|---|---|---|---|---|
| 5,289,498 A | * | 2/1994 | Hurlbut et al. | 375/142 |
| 5,565,764 A | * | 10/1996 | Priebe et al. | 324/76.21 |
| 5,640,430 A | * | 6/1997 | Cudak et al. | 375/343 |
| 5,844,545 A | | 12/1998 | Suzuki et al. | |
| 5,918,171 A | * | 6/1999 | Funke et al. | 455/403 |
| 6,075,807 A | * | 6/2000 | Warren et al. | 375/143 |
| 6,360,090 B1 | * | 3/2002 | Holcombe et al. | 455/307 |
| 6,363,107 B1 | * | 3/2002 | Scott | 375/150 |
| 6,590,872 B1 | * | 7/2003 | Shiue et al. | 370/314 |
| 6,771,976 B1 | | 8/2004 | Koyama | |
| 2001/0022807 A1 | * | 9/2001 | Yotsumoto | 375/147 |
| 2001/0050948 A1 | * | 12/2001 | Ramberg et al. | 375/148 |
| 2002/0041637 A1 | * | 4/2002 | Smart et al. | 375/316 |
| 2003/0179839 A1 | | 9/2003 | Astrachan | |
| 2003/0215002 A1 | * | 11/2003 | Gorday et al. | 375/147 |
| 2006/0002485 A1 | | 1/2006 | Moher | |

FOREIGN PATENT DOCUMENTS

| | | |
|---|---|---|
| GB | 2347831 A | 9/2000 |
| JP | 7021060 | 1/1995 |
| JP | 2002118542 A | 4/2002 |

\* cited by examiner

*Primary Examiner*—Khai Tran

(57) ABSTRACT

A method for detecting validity of a received signal begins by performing an auto-correlation on the received signal to produce an auto-correlation resultant. The process continues by performing a cross-correlation on the receive signal with a reference signal to produce a cross-correlation resultant. The process then continues by mathematically relating the auto-correlation resultant with the cross-correlation resultant to produce a mathematical correlation relationship. The process then proceeds by interpreting the mathematical correlation relationship to indicate whether the receive signal is valid or not.

18 Claims, 6 Drawing Sheets functional diagram of data detection module 38

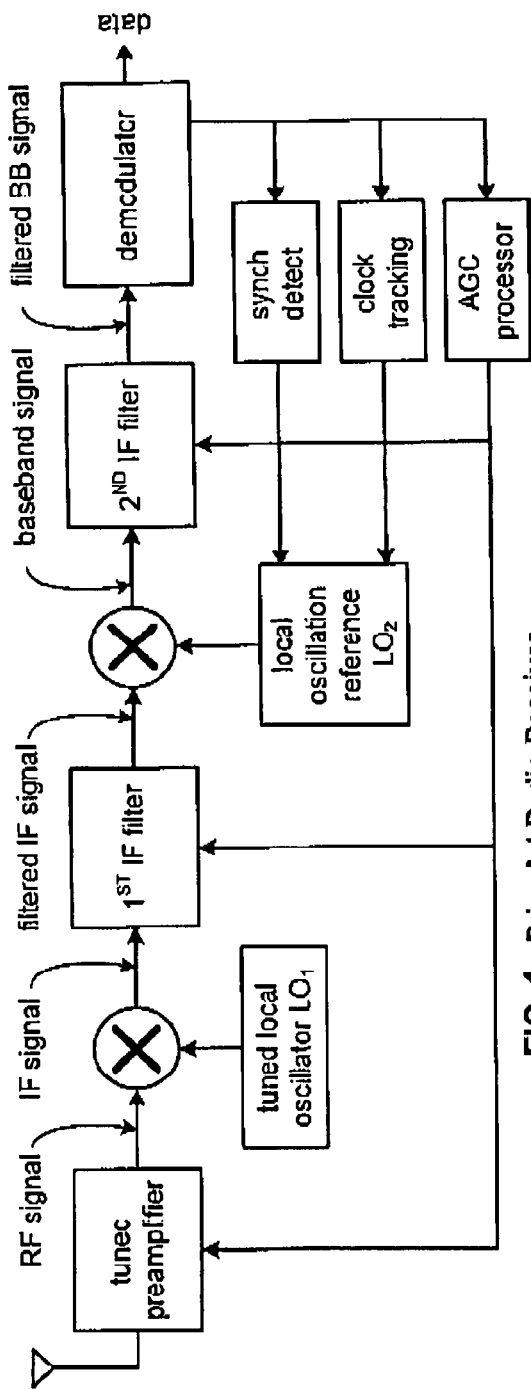
FIG. 1 - Prior Art Radio Receiver
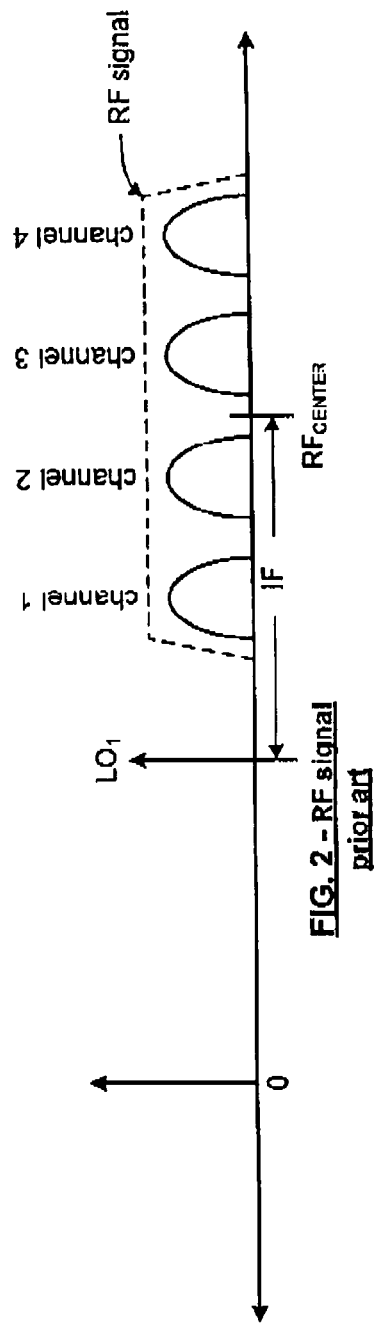
FIG. 2 - RF signal prior art

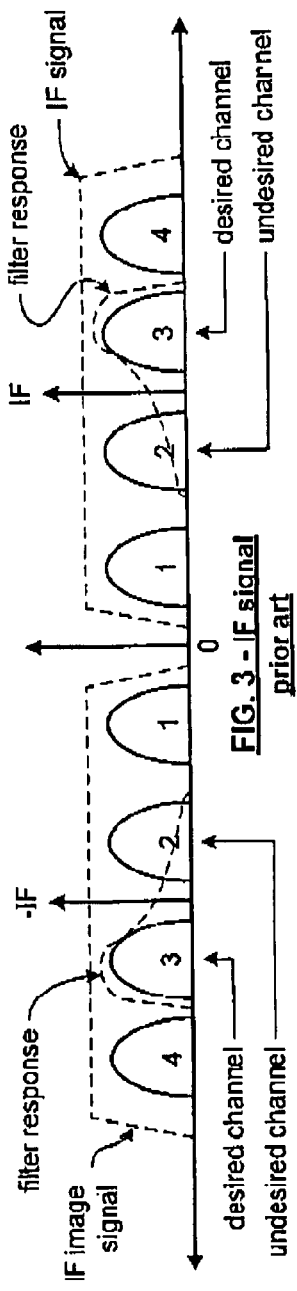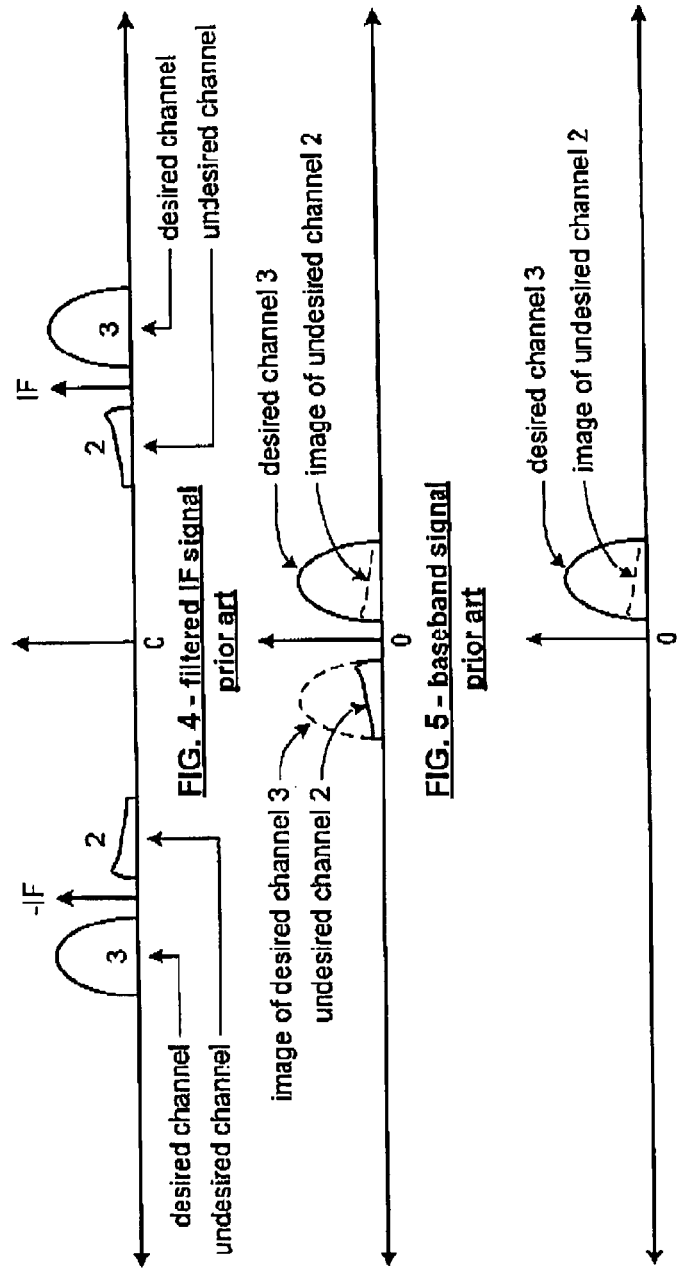

radio receiver 10

FIG. 8 functional diagram of data detection module 38

METHOD AND APPARATUS FOR ACCURATELY DETECTING VALIDITY OF A RECEIVED SIGNAL

This patent application is claiming priority under 35 USC § 120 as a continuation in part application to patent application entitled METHOD AND APPARATUS FOR ACCURATELY DETECTING PRESENCE OF A VALID SIGNAL, having a Ser. No. of 10/103,325 and a filing date of Mar. 21, 2002 now U.S. Pat. No. 7,170,955.

BACKGROUND OF THE INVENTION

1. Technical Field of the Invention

This invention relates generally to wireless communication systems and more particularly to receiving transmissions within such wireless communication systems.

2. Description of Related Art

FIG. 1 is a schematic block diagram of a prior art radio receiver that includes a tuned preamplifier, a mixer, tuned local oscillator, $1^{st}$ IF filter stage, another mixer, a local oscillation reference ($LO_s$), a $2^{nd}$ IF filter, a demodulator, a synchronization detect module, clock tracking module and automatic gain control (AGC) processor. The tuned preamplifier receives incoming RF signals via the antenna to produce an RF signal. The frequency spectrum of the RF signal is shown in FIG. 2 for multi-channel RF communications such as those prescribed within the IEEE 802.11 standard. As shown in FIG. 2, the RF signal may include a plurality of channels, in this example 4. The center of the RF signal is an intermediate frequency above the local oscillation ($LO_1$) produced by the tuned local oscillator. Note that, in the alternative, the center of the RF signal is an intermediate frequency below the local oscillation ($LO_1$).

Returning to the description of FIG. 1, the mixer, mixes the RF signal with the tuned local oscillation ($LO_1$) to produce an intermediate frequency (IF) signal. The frequency spectrum of the IF signal is shown in FIG. 3. As shown in FIG. 3, the IF signal includes the 4 channels centered about the intermediate frequency (IF). In addition, an image of the IF signal is produced and is centered about the negative IF. In this example, the desired channel corresponds to channel 3 and the undesired channels are channels 1, 2 and 4. Returning to the description of FIG. 1, the $1^{st}$ IF filter stage filters the IF signal to produce a filtered IF signal. The $1^{st}$ IF filter is typically a SAW filter and has a frequency response as illustrated in FIG. 3. The frequency spectrum of the resulting filtered IF signal is shown in FIG. 4. As shown in FIG. 4, the desired channel 3 passes through the filter while channels 1 and 4 of the undesired channels are completely attenuated and a portion of channel 2 is attenuated. This also occurs on the image side of the filtered IF signal.

Returning to the discussion of FIG. 1, the next mixer, mixes the filtered IF signal with a $2^{nd}$ local oscillation ($LO_2$) to produce a baseband signal. The baseband signal is subsequently filtered by the $2^{nd}$ IF filter stage to produce a filtered baseband signal. With reference to FIGS. 5 and 6, FIG. 5 illustrates the frequency spectrum of the baseband signal including the desired channel 3, the image of the undesired channel 2 overlapping and the image of the desired channel 3 overlapping with the undesired channel 2. When this is filtered, as shown in FIG. 6, the resulting filtered baseband signal includes the desired channel 3 and the image of the undesired channel 2.

When the desired channel 3 is actually a valid signal, the inclusion of the image of the undesired channel 2 presents minimal problems. If, however, there is no desired channel 3, but only the image of the undesired channel 2, the sync detect and corresponding clock tracking may indicate that a valid signal is present and activate the entire receiver to recapture the data from the filtered baseband signal. However, since this data corresponds to undesired information, the recovered data will be useless.

In general, the sync detect may be a correlation, which compares the incoming baseband signal to a stored representation of a valid preamble. If the beginning portion of the incoming baseband signal (e.g., the portion that would correlate to a preamble of a valid signal) matches the stored valid preamble, the correlator indicates that the signal is valid. If the correlator falsely identifies a valid signal, the subsequent processing by the receiver is wasted. For portable wireless communication devices, wasted receiver processing corresponds to wasted power, which reduces the battery life of a wireless communication device, and reduced data throughput. Such false identifications occur more frequently as the signal strength of the received RF signal decreases. As such, many wireless communication devices have a minimum signal strength requirement to reduce the number of false identifications, but do so at the cost of limiting the range of the wireless communication device and data throughput.

Therefore, a need exists for a method and apparatus to accurately detect the presence of a valid signal in view of undesired signals.

BRIEF SUMMARY OF THE INVENTION

The method and apparatus for accurately detecting the validity of a received signal of the present invention substantially meets these needs and others. In an embodiment, a method begins by performing an auto-correlation on the received signal to produce an auto-correlation resultant. The process continues by performing a cross-correlation on the receive signal with a reference signal to produce a cross-correlation resultant. The process then continues by mathematically relating the auto-correlation resultant with the cross-correlation resultant to produce a mathematical correlation relationship. The process then proceeds by interpreting the mathematical correlation relationship to indicate whether the receive signal is valid or not. With such a method and apparatus, in the absence of a valid signal, the image of an undesired channel will not falsely trigger the indication of a valid signal, thus a greater level of accuracy is achieved in detecting the presence of a valid signal.

BRIEF DESCRIPTION OF THE SEVERAL VIEWS OF THE DRAWINGS

FIG. 1 is a schematic block diagram of a prior art radio receiver;

FIGS. 2-6 illustrate frequency domain representations of the signals within the prior art receiver of FIG. 1;

DETAILED DESCRIPTION OF THE INVENTION

Figure 7:
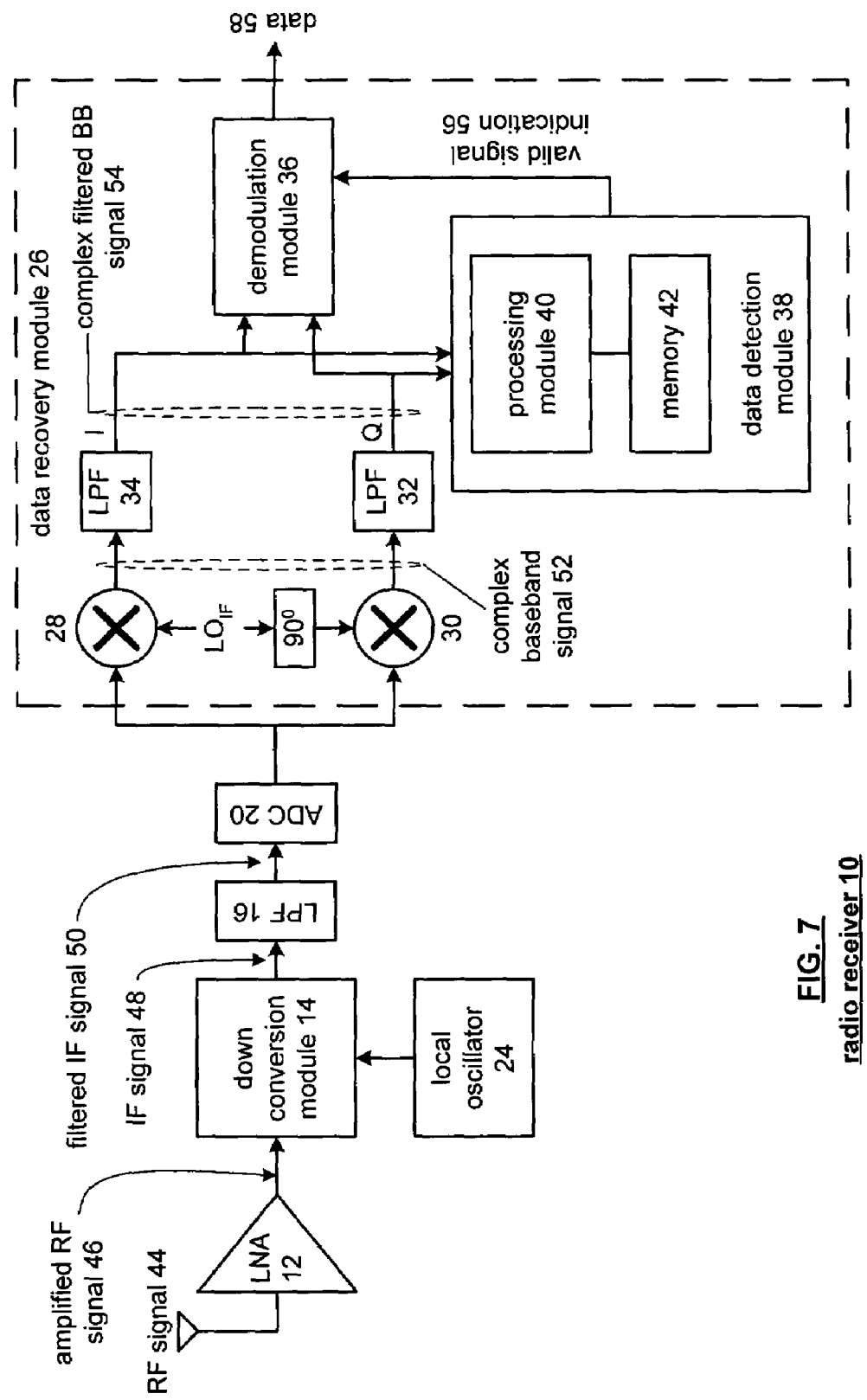
FIG. 7 is a schematic block diagram of a radio receiver in accordance with the present invention.

FIG. 7 illustrates a schematic block diagram of a radio receiver 10 that includes a low noise amplifier 12, a down conversion module 14, a low pass filter 16, an analog to digital converter 20, a local oscillator 24, and a data recovery module 26. The data recovery module 26 includes low IF mixers 28 and 30, low pass filters 32 and 34, a demodulation module 36 and a data detection module 38. The data detection module 38 includes a processing module 40 and memory 42. The processing module 40 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 42 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 40 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 42 stores, and the processing module 40 executes, operational instructions corresponding to at least some of the steps and/or functions illustrated in FIGS. 7-10.

In operation, the radio receiver 10 receives a radio frequency (RF) signal 44 via an antenna, which provides the RF signal 44 to the low noise amplifier 12. The low noise amplifier 12 amplifies the RF signal 44 to produce an amplified RF signal 46. As one of average skill in the art will appreciate, a bandpass filter may precede and/or follow the low noise amplifier to tune the radio receiver to a particular radio frequency.

The down conversion module 14 mixes the amplified RF signal 28 with a local oscillation provided by the local oscillator 24 to produce an intermediate frequency (IF) signal 48. The down conversion module 14 may include one or more intermediate frequency stages to step down the carrier frequency from that of the radio frequency to the intermediate frequency. Low pass filter 16 filters the IF signal 48 to produce a filtered IF signal 50. The analog to digital converter 20 converts the filtered IF signal 50 into a digital IF signal.

The data recovery module 26 receives the digital IF signal via the low IF mixers 28 and 30. The low IF mixers 28 and 30 mix the digital IF signal with a low IF local oscillation and a 90° phase shifted representation thereof, respectively, to produce a complex baseband signal 52 (i.e., a baseband signal that includes an in-phase (I) component and a quadrature (Q) component). The low pass filters 32 and 34 filter the complex baseband signal 52 to produce a complex filtered baseband signal 54.

The data detection module 38 interprets the complex filtered baseband signal 54, as will be described in greater detail with reference to FIGS. 8-10, to determine whether the complex filtered baseband signal 54 is a valid signal. If so, the data detection module 38 generates a valid signal indication signal 56, which is provided to the demodulation module 36. In response to the valid signal indication signal 56, the demodulation module 36 demodulates the complex filtered baseband signal 54 to recapture data 58.

Figure 8:
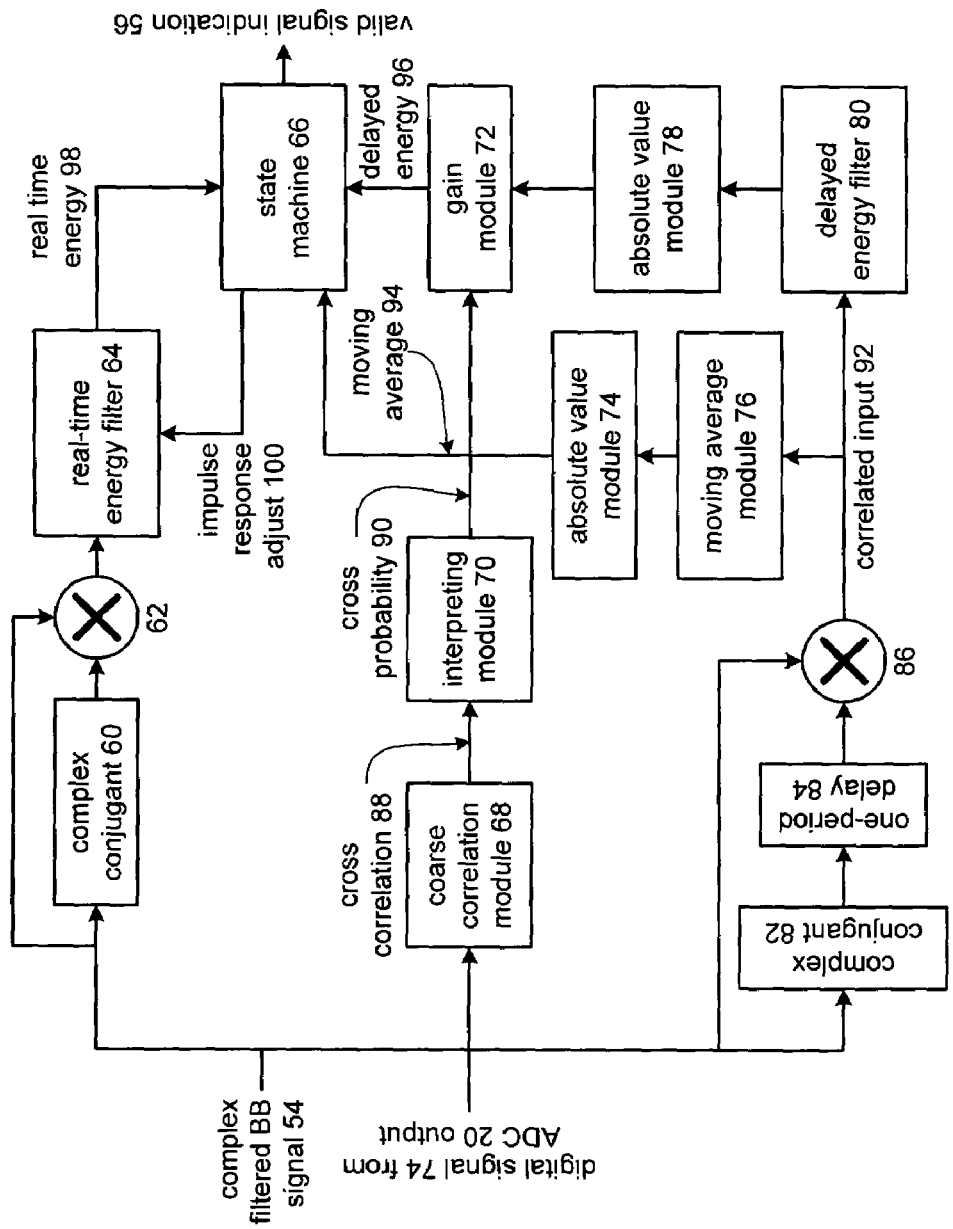
FIG. 8 is a functional diagram of the data detection module of the radio receiver of FIG. 7.

FIG. 8 illustrates a functional diagram of the data detection module 38 that includes a complex conjugate module 60, a multiplier 62, a real time energy filter 64, a $2^{nd}$ complex conjugate module 82, a one-period delay module 84, a $2^{nd}$ multiplier 86, a delayed energy filter 80, a state machine 66, an absolute value module 78, a gain module 72, a coarse correlation module 68, an interpreting module 70, a second absolute value module 74, and a moving average module 76.

The filtered baseband signal 54 is a complex signal that is provided to the complex conjugate modules 60 and 82. The complex conjugate module 60 performs a complex conjugate function on filtered baseband signal 54 to produce a conjugate value. The multiplier 62 multiplies the filtered baseband signal 54 with the complex conjugate 60's output to produce a real energy input. For example, if the filtered baseband input 56 is represented by (Real component+Imaginary component) then the complex conjugate module produces the conjugate value of (Real component−Imaginary component) and the multiplier 62 produces the real energy input of $(R^2+I^2)$.

The real time energy filter 64 receives real energy input from multiplier 62 and produces a real time energy value 98. The real time energy filter 64 is essentially a low pass filter that may have its impulse response adjusted in accordance with an impulse response adjust signal 100. For instance, during early detection of a valid signal, the impulse response of the real time energy filter may be fast and then slowed as the likelihood that the input is a valid signal. This allows the real time energy to reach an appropriate level quickly for valid signals and reduce the deviation of the level as the likelihood of the input being valid increases. The real time energy filter 64 provides the real time energy level 98 to the state machine 66, which determines the valid signal indication 56 as will be discussed below.

The complex conjugate module 82 performs a complex conjugate function on the filtered baseband signal 54 to produce a complex conjugate input. The one period delay module 84 delays the complex conjugate input to produce a delayed complex conjugate input. The multiplier 86 multiplies the filtered baseband signal 54 with the delayed complex conjugate input to produce a correlated input 92. If the filtered baseband signal 54 is valid, the correlated input 92 will resemble the output of multiplier 48 but delayed by one period of a repetitive signal in the preamble of a valid signal. If the filtered baseband signal 54 is not a valid signal, the correlated input 92 will resemble noise. For example, for an IEEE802.11a compliant wireless communication device, the preamble includes a short training sequence and a long training sequence. The short training sequence includes repetitive signals that are 16 samples in length while the long training period includes repetitive signals that are 64 samples in length. As such, during the short training sequence, the one period delay is set to correspond to 16 samples and for the long training sequence is set to correspond to 64 samples. Thus, for the short training sequence, the correlated input 92 will resemble the output of multiplier 62 with the addition of a noise term.

The multiplier 86 provides the correlated input 92 to the moving average module 76 and to the delayed energy filter 80. The delayed energy filter 80 filters the correlated input 92 to produce an energy level of the correlated input. The absolute value module 78 generates an absolute value for the energy level of the correlated input and provides it to the gain module 72.

The gain module 72 adjusts the magnitude of the energy level of the correlated input based on a coarse probability 90 to produce the delayed energy level 96. The generation of the coarse probability 90 will be discussed subsequently. The state machine 66 receives the delayed energy level 96 and compares it with the real time energy level 98 to produce a probability of the input signal being a valid signal. The state machine 66 also receives a moving average 94, which it uses in comparison with the real time energy 98 to conclusively determine whether the filtered baseband signal 54 is a valid signal or not. If the filtered baseband signal 54 is a valid signal, the state machine 66 generates a valid signal indication 56. If the filtered baseband signal 54 is not a valid signal, the state machine 66 does not generate the valid signal indication 56 and the demodulation module 36 is not enabled. Thus, power consumption is reduced since the data detection module 38 has substantially reduced and/or eliminated false identifications of valid signals.

The moving average module 76 produces a moving average of the correlated input 92. The absolute value module 74 provides an absolute value of the output of the moving average module 76 to produce the moving average 94. The state machine 66 interprets the moving average with respect to the real time energy level at the end of an initialization sequence (e.g., the end of the short training sequence and/or long training sequence for an 802.11a implementation). The state machine 66 then indicates that the input signal is valid when the interpretation of the moving average 94 with the respect to the real time energy level 98 was favorable. This will be discussed in greater detail with reference to FIG. 9.

The coarse correlation module 68 receives the complex digital signal 74 and produces a coarse correlation value 88. The coarse correlation module 68 is providing a simple correlation function that compares the complex digital signal 74 with a stored representation of a valid preamble of a signal. The interpreting module 70 receives the coarse correlation 88 and generates a coarse probability 90 therefrom. In general, the interpreting module 70 is interpreting the coarse correlation 88 to determine the likelihood that the filtered baseband signal 54 is valid and to establish the gain level for the gain module 72 proportional to the likelihood. The more likely the input is valid, the greater the coarse probability 90 will be, thus the greater the gain level of the gain module 72 will be.

Figure 9:
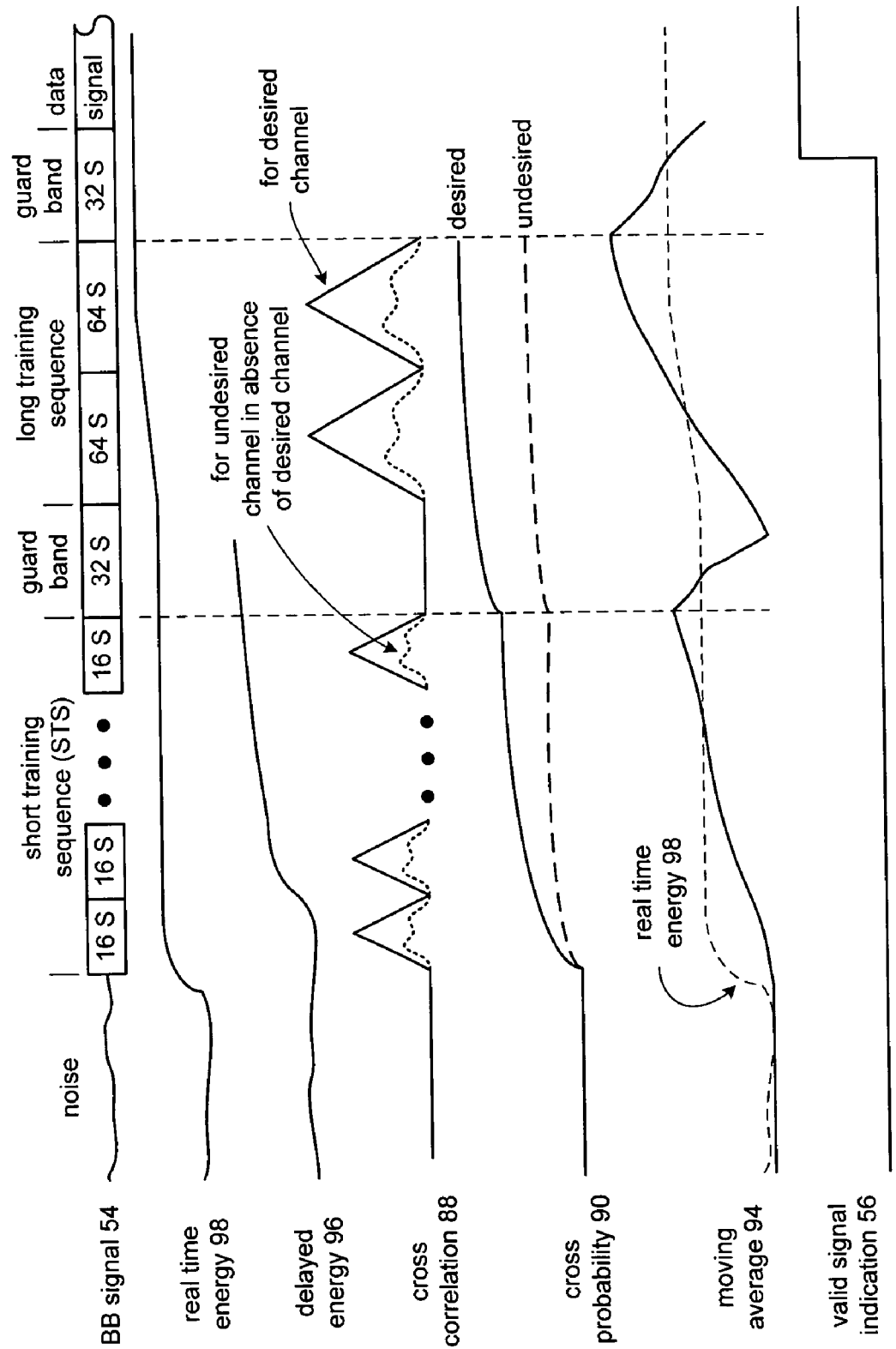
FIG. 9 is a timing relationship corresponding to the functional diagram of FIG. 8.

FIG. 9 illustrates a graphical representation of the signals produced by the data detection module 38 of FIG. 8. The baseband signal 54 includes a noise section and a valid signal portion. The valid signal portion, for 802.11a implementation includes a short training sequence, a guard band, a long training sequence, a $2^{nd}$ guard band and data. During the noise portion of the baseband signal 54, i.e., when no data is being received, the real time energy filter 64 is producing real time energy level 98, which is relatively low and corresponds to the energy level of the noise. Similarly, the delayed energy level 96 is initially low due to the noise. When the $1^{st}$ short training sequence signal is received (i.e., the first 16 samples block of the STS), the real time energy filter is in a fast impulse response mode and ramps up quickly to indicate the energy of the first short training sequence signal. Simultaneously, the coarse correlation signal 88 is generated to indicating that there is energy in the baseband signal that correlates to the stored representation on a valid preamble.

For the $1^{st}$ short training sequence signal, the delayed energy 96 remains low. This is due to the one period delay module 84, which for an IEEE 802.11a implementation is initially set to provide a delay equivalent to 16 samples. After the one period delay, the delayed energy 96 rises correspondingly to the gain of the gain module 72 as well as the energy within the short training sequence signals.

The coarse correlation 88 continues to indicate that a signal is present and that it correlates with the stored valid preamble. As such, the interpreting module 70 is increasing the coarse probability 90. As such, the gain for the delayed energy path via the gain module 72 is increasing and the magnitude of the delayed energy 96 increases and exceeds the magnitude of the real time energy level 98, which provides a good first indication that the baseband signal 54 is currently providing a valid signal. As shown in FIG. 9, the cross correlation 88 and the cross, or coarse, probability 90 each includes a solid line waveform and a dashed-line waveform. The solid line waveform corresponds to a signal associated with a desired channel and the dashed line waveform corresponds to a signal associated with an undesired channel in the absence of a signal of the desired channel. Refer to the discussions of FIGS. 2-6 for a description of a desired channel and an undesired channel.

The moving average 94, which represents an autocorrelation, is increasing as the valid preamble is detected until the end of the short training sequence. At that time, the moving average 94 begins to decay. At a predetermined time after the end of the short training sequence has been indicated, the current moving average 94, which represents the cumulative energy level of the plurality of repetitive signals of the STS, is compared with the peak value of the moving average. If the moving average 94 has decayed sufficiently from its peak at the predetermined time (which indicates that a signal was the cause for the rise in the moving average and not some random occurrence of energy bursts that would continue to increase, or at least keep from decaying, the moving average) the comparison is favorable and the state machine increases the probability that the input is a valid signal. If the magnitude of the moving average 94 has not sufficiently decayed from its peak value, the state machine indicates that the signal is invalid and the processing starts all over.

When the probability that the input is valid is generated, the data detection module switches into processing the long training sequence of the preamble of the valid signal. As such, the moving average path, having the one period delay changed from 16 samples to 64 samples within delay module 84 produces a new moving average 94. The new moving average 94 represents a cumulative energy level of the LTS and is interpreted to determine the end of the long training sequence. At the end of the long training sequence, the state machine compares the magnitude of the moving average 94 with the magnitude of the real time energy 98. If the moving average 94 is greater than the real time energy 98, the state machine conclusively determines that the signal is valid. If the moving average 94 is less than the real time energy 98 the state machine indicates that the signal is not valid.

This occurs equally for the signal of the desired channel and the signal of the undesired channel in the absence of a desired channel. However, as shown, the cross correlation 88 and the corresponding probability 90 have a lower magnitude for the signal of the undesired channel in the absence of a desired channel than the signal of the desired channel. The auto correlation, or the moving average, has essentially the same magnitude for the signal of the undesired channel in the absence of a desired channel than the signal of the desired channel. Thus, based on the difference in magnitude of the cross correlation with respect to the auto correlation, a determination can be made as to whether the signal being analyzed is one from a desired channel or from an undesired channel in the absence of a desired channel. Such a determination is based on a mathematical relationship between the auto correlation and the cross correlation at the end of the STS, which may be expressed as $$\sqrt{\frac{autocorr}{refcorr}}\left(\frac{xcorr}{autocorr}\right) > K$$

wherein the autocorr corresponds to the autocorrelation resultant, the refcorr corresponds to a reference autocorrelation, the xcorr corresponds to the cross correlation resultant, and the K corresponds to a valid signal threshold. As such, the data detection module 38 provides a conclusive determination whether the baseband signal 54 is valid before subsequent digital processing is activated. As such, power consumption is reduced, the range of wireless communication devices is increased, and data throughput is increased since the data detection module 38 is extremely sensitive in detecting the validity of incoming signals and can do so when the signal strength is low.

Figure 10:
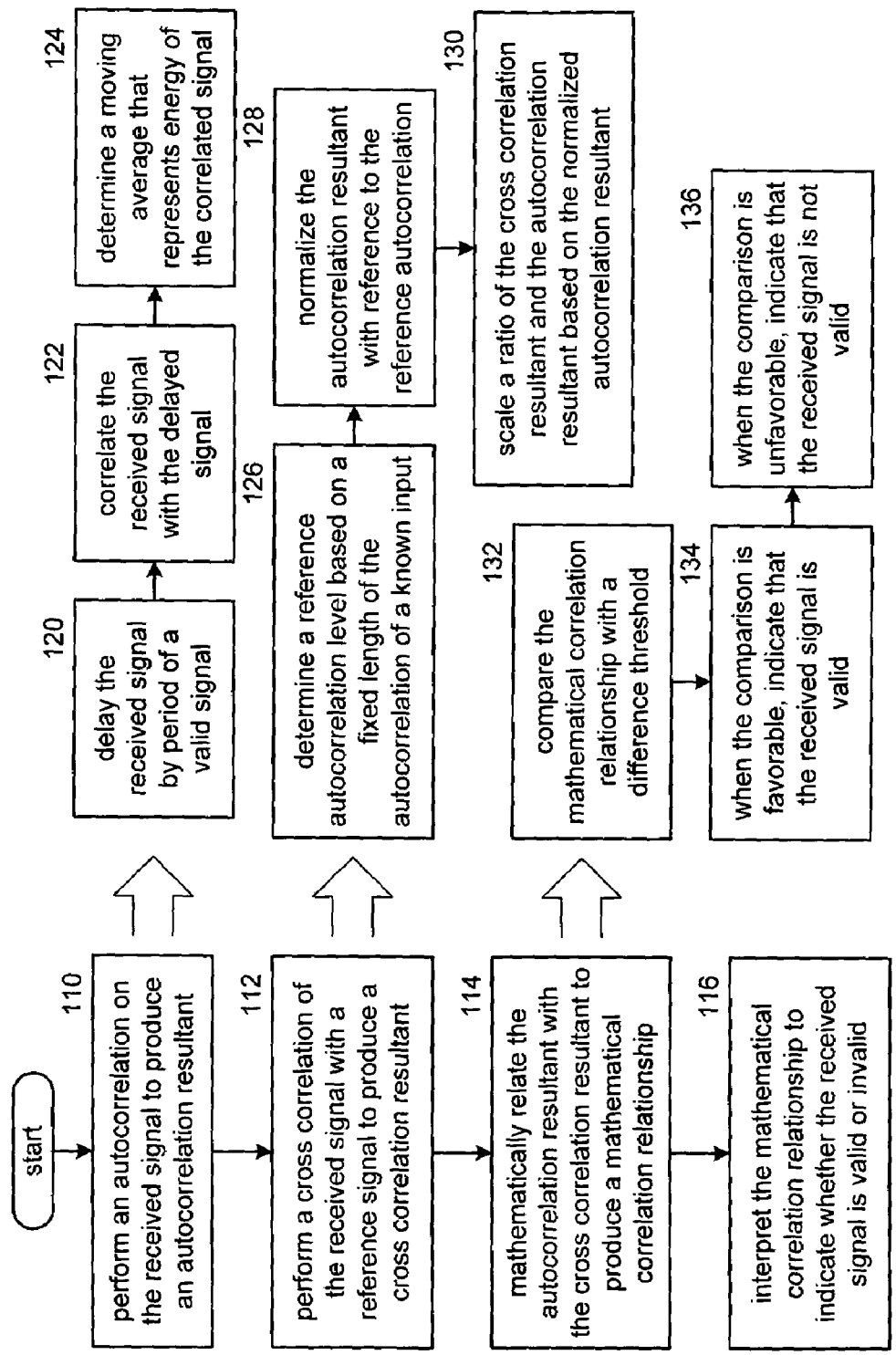
FIG. 10 is a logic diagram of a method for accurately detecting validity of a received signal.

FIG. 10 is a logic diagram of a method for accurately detecting validity of a received signal. The process begins at Step 110 where an auto-correlation is performed on the receive signal producing an auto-correlation resultant. This may be done as illustrated in Steps 120-124. At Step 120, the receive signal is delayed by a period of the valid signal. The process then proceeds to Step 122 where the receive signal is correlated with the delayed signal. The process then proceeds to Step 124 where a moving average, or auto-correlation, is determined, which represents the energy of the correlated signal.

From Step 110, the process proceeds to Step 112 where a cross-correlation is performed on the receive signal with a reference signal to produce a cross-correlation resultant. This may be done as shown in Steps 126-130. At Step 126, a reference auto-correlation level is determined based on a fixed length of the auto-correlation of a known input. The process then proceeds to Step 128 where the auto-correlation resultant is normalized with reference to a reference auto-correlation. The process then proceeds to Step 130 where a ratio of the cross-correlation resultants and the auto-correlation resultants are scaled based on the normalized auto-correlation resultant. This was graphically illustrated with reference to FIG. 9.

From Step 112, the process proceeds to Step 114 where the auto-correlation resultant is mathematically related to the cross-correlation resultant to produce a mathematical correlation relationship. This may be done as illustrated in Steps 132-136. At Step 132, the mathematical correlation relationship is compared with a difference threshold. The process proceeds to Step 134 when the comparison is favorable, indicating that the receive signal is valid. At Step 136, if the comparison was unfavorable indicating that the receive signal is not valid. Alternatively, the mathematical relationship may be achieved as $$\sqrt{\frac{autocorr}{refcorr}}\left(\frac{xcorr}{autocorr}\right) > K$$

wherein the autocorr corresponds to the autocorrelation resultant, the refcorr corresponds to a reference autocorrelation, the xcorr corresponds to the cross correlation resultant, and the K corresponds to a valid signal threshold.

From Step 114, the process proceeds to Step 116 where the mathematical correlation relationship is interpreted to indicate whether the receive signal is valid or not.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a method and apparatus for accurately determining the validity of a receive signal. As one of average skill in the art will appreciate, other embodiments may be derived from the teachings of the present invention without deviating from the scope of the claims.

What is claimed is:

1. A method for accurately detecting validity of a received signal, the method comprises:
    performing an autocorrelation on the received signal to produce an autocorrelation resultant;
    performing a cross correlation of the received signal with a reference signal to produce a cross correlation resultant;
    mathematically relating the autocorrelation resultant with the cross correlation resultant to produce a mathematical correlation relationship; and
    interpreting the mathematical correlation relationship to indicate whether the received signal is valid or invalid.

2. The method of claim 1, wherein the performing the autocorrelation on the received signal further comprises:
    delaying the received signal by period of a valid signal to produce a delayed signal;
    correlating the received signal with the delayed signal to produce a correlated signal; and
    determining a moving average that represents energy of the correlated signal.

3. The method of claim 1, wherein the mathematically relating the autocorrelation resultant further comprises:
    determining a reference autocorrelation level based on a fixed length of the autocorrelation of a known input;
    normalizing the autocorrelation resultant with reference to the reference autocorrelation to produce a normalized autocorrelation resultant;
    scaling a ratio of the cross correlation resultant and the autocorrelation resultant based on the normalized autocorrelation resultant to produce the mathematical correlation relationship.

4. The method of claim 3, wherein the interpreting the mathematical correlation relationship further comprises:
    comparing the mathematical correlation relationship with a difference threshold;
    when the comparison of the mathematical correlation relationship to the difference threshold is favorable, indicating that the received signal is valid; and when the comparison of the mathematical correlation relationship to the difference threshold is unfavorable, indicating that the received signal is not valid.

5. The method of claim 1, wherein the mathematically relating the autocorrelation resultant with the cross correlation resultant further comprises:

$$\sqrt{\frac{autocorr}{refcorr}}\left(\frac{xcorr}{autocorr}\right) > K$$

wherein the autocorr corresponds to the autocorrelation resultant, the refcorr corresponds to a reference autocorrelation, the xcorr corresponds to the cross correlation resultant, and the K corresponds to a valid signal threshold.

6. The method of claim 5 further comprises:
determining the reference autocorrelation based on a fixed length of the autocorrelation of a known input.

7. An apparatus for accurately detecting validity of a received signal, the apparatus comprises:
processing module; and
memory operably coupled to the processing module, wherein the memory includes operational instructions that cause the processing module to:
perform an autocorrelation on the received signal to produce an autocorrelation resultant;
perform a cross correlation of the received signal with a reference signal to produce a cross correlation resultant;
mathematically relate the autocorrelation resultant with the cross correlation resultant to produce a mathematical correlation relationship; and
interpret the mathematical correlation relationship to indicate whether the received signal is valid or invalid.

8. The apparatus of claim 7, wherein the memory further comprises operational instructions that cause the processing module to perform the autocorrelation on the received signal by:
delaying the received signal by period of a valid signal to produce a delayed signal;
correlating the received signal with the delayed signal to produce a correlated signal; and
determining a moving average that represents energy of the correlated signal.

9. The apparatus of claim 7, wherein the memory further comprises operational instructions that cause the processing module to mathematically relate the autocorrelation resultant by:
determining a reference autocorrelation level based on a fixed length of the autocorrelation of a known input;
normalizing the autocorrelation resultant with reference to the reference autocorrelation to produce a normalized autocorrelation resultant;
scaling a ratio of the cross correlation resultant and the autocorrelation resultant based on the normalized autocorrelation resultant to produce the mathematical correlation relationship.

10. The apparatus of claim 9, wherein the memory further comprises operational instructions that cause the processing module to interpret the mathematical correlation relationship by:
comparing the mathematical correlation relationship with a difference threshold;
when the comparison of the mathematical correlation relationship to the difference threshold is favorable, indicating that the received signal is valid; and
when the comparison of the mathematical correlation relationship to the difference threshold is unfavorable, indicating that the received signal is not valid.

11. The apparatus of claim 7, wherein the memory further comprises operational instructions that cause the processing module to mathematically relate the autocorrelation resultant with the cross correlation resultant by:

$$\sqrt{\frac{autocorr}{refcorr}}\left(\frac{xcorr}{autocorr}\right) > K$$

wherein the autocorr corresponds to the autocorrelation resultant, the refcorr corresponds to a reference autocorrelation, the xcorr corresponds to the cross correlation resultant, and the K corresponds to a valid signal threshold.

12. The apparatus of claim 11, wherein the memory further comprises operational instructions that cause the processing module to:
determine the reference autocorrelation based on a fixed length of the autocorrelation of a known input.

13. A radio receiver comprises:
low noise amplifier operably coupled to amplify a radio frequency (RF) signal to produce an amplified RF signal;
down conversion module operably coupled to convert the amplified RF signal into a baseband signal;
data recovery module operably coupled to recapture data from the baseband signal, wherein the data recovery module includes:
data detection module operably coupled to detect validity of the baseband signal to produce a valid signal indication; and
demodulation module operably coupled to demodulate the baseband signal to produce the data in accordance with the valid signal indication, wherein the data detection module includes:
processing module; and
memory operably coupled to the processing module, wherein the memory includes operational instructions that cause the processing module to:
perform an autocorrelation on the received signal to produce an autocorrelation resultant;
perform a cross correlation of the received signal with a reference signal to produce a cross correlation resultant;
mathematically relate the autocorrelation resultant with the cross correlation resultant to produce a mathematical correlation relationship; and
interpret the mathematical correlation relationship to indicate whether the received signal is valid or invalid.

14. The radio receiver of claim 13, wherein the memory further comprises operational instructions that cause the processing module to perform the autocorrelation on the received signal by:
delaying the received signal by period of a valid signal to produce a delayed signal;
correlating the received signal with the delayed signal to produce a correlated signal; and
determining a moving average that represents energy of the correlated signal.

15. The radio receiver of claim 13, wherein the memory further comprises operational instructions that cause the processing module to mathematically relate the autocorrelation resultant by:

determining a reference autocorrelation level based on a fixed length of the autocorrelation of a known input;

normalizing the autocorrelation resultant with reference to the reference autocorrelation to produce a normalized autocorrelation resultant;

scaling a ratio of the cross correlation resultant and the autocorrelation resultant based on the normalized autocorrelation resultant to produce the mathematical correlation relationship.

16. The radio receiver of claim 15, wherein the memory further comprises operational instructions that cause the processing module to interpret the mathematical correlation relationship by:

comparing the mathematical correlation relationship with a difference threshold;

when the comparison of the mathematical correlation relationship to the difference threshold is favorable, indicating that the received signal is valid; and when the comparison of the mathematical correlation relationship to the difference threshold is unfavorable, indicating that the received signal is not valid.

17. The radio receiver of claim 13, wherein the memory further comprises operational instructions that cause the processing module to mathematically relate the autocorrelation resultant with the cross correlation resultant by:

$$\sqrt{\frac{autocorr}{refcorr}} \left(\frac{xcorr}{autocorr}\right) > K$$

wherein the autocorr corresponds to the autocorrelation resultant, the refcorr corresponds to a reference autocorrelation, the xcorr corresponds to the cross correlation resultant, and the K corresponds to a valid signal threshold.

18. The radio receiver of claim 17, wherein the memory further comprises operational instructions that cause the processing module to:

determine the reference autocorrelation based on a fixed length of the autocorrelation of a known input.

* * * * *